United States Patent [19]

Osaka

[11] Patent Number: 5,661,440
[45] Date of Patent: Aug. 26, 1997

[54] PLL FREQUENCY SYNTHESIZER EMPLOYING PLURAL CONTROL FREQUENCIES TO MINIMIZE OVERSHOOT

[75] Inventor: Masahiko Osaka, Tokyo, Japan

[73] Assignee: NEC Corporation, Tokyo, Japan

[21] Appl. No.: 437,059

[22] Filed: May 9, 1995

[30] Foreign Application Priority Data

May 9, 1994 [JP] Japan .................................. 6-095154

[51] Int. Cl.⁶ ...................................................... H03L 7/18
[52] U.S. Cl. ................................................ 331/16; 331/25
[58] Field of Search .................................. 331/1 A, 16, 25

[56] References Cited

U.S. PATENT DOCUMENTS 4,516,083  5/1985  Turney ........................ 331/1 A
4,745,371  5/1988  Haine ......................... 331/1 A

FOREIGN PATENT DOCUMENTS 0461358  12/1991  European Pat. Off. .
3-214925  9/1991  Japan .

OTHER PUBLICATIONS

Patent Abstracts of Japan, vol. 15, No. 494 (E–1145).

Primary Examiner—Siegfried H. Grimm
Attorney, Agent, or Firm—Sughrue, Mion, Zinn, Macpeak & Seas

[57] ABSTRACT

To switch a frequency of an output signal of a voltage controlled oscillator from a first frequency to a second frequency, a controller provides to a variable frequency divider such a frequency divisor that the voltage controlled oscillator produces a signal having a predetermined frequency ranging between the first and second frequencies. When the detected frequency of the signal output by the voltage controlled oscillator reaches a predetermined frequency, the controller changes the frequency divisor provided to the variable frequency divider to such a frequency divisor that the voltage controlled oscillator produces a signal having the second frequency.

11 Claims, 7 Drawing Sheets

PLL FREQUENCY SYNTHESIZER EMPLOYING PLURAL CONTROL FREQUENCIES TO MINIMIZE OVERSHOOT

BACKGROUND OF THE INVENTION

1. Field of the Invention

The present invention relates to a PLL frequency synthesizer, and more particularly to a PLL frequency synthesizer for switching frequencies at high speed.

2. Description of the Related Art

A phase looked-loop (PLL) frequency synthesizer is used in a transmitter and/or a receiver in a radio apparatus and the like for the purpose of generating a desired frequency. The PLL frequency synthesizer is constituted by a reference oscillator, a voltage controlled oscillator (VCO), a phase comparator and a low-pass filter (LPF). The phase comparator detects a phase difference between an output frequency of the reference oscillator and an output frequency of the VCO. A signal corresponding with this phase difference is supplied as a control voltage to the voltage controlled oscillator through the LPF.

When this type of PLL frequency synthesizer is used in, e.g., mobile communication, high speed frequency switching is desired. Then, a PLL frequency synthesizer for switching frequencies at high speed is disclosed in, for example, Japanese Laid-Open Patent Application No. 214925/1991 (JP-A-03-214925). In this PLL frequency synthesizer, a switch is provided in parallel with the LPF as a loop filter. The switch is turned on when the frequency locking is started in the frequency switching operation and the input/output of the LPF is short-circuited, thereby supplying the control voltage corresponding with the phase difference to the VCO without the LPF.

In the above PLL frequency synthesizer, however, the response characteristics of the loop become unstable or switching noise is generated when the switch is turned off. Further, since the voltage which has already been charged in the loop filter is different from the control voltage for generating a desired frequency, the control voltage supplied to the VCO fluctuates.

As to the VCO, one having high modulation sensitivity with which the oscillation frequency greatly varies due to a small change in the control voltage is usually used. When noise is generated or the control voltage fluctuates as described above, the oscillation frequency therefore fluctuates even if it approaches a desired frequency. The time for locking the frequency is thus prolonged.

In addition, the conventional PLL frequency synthesizer stabilizes the oscillation frequency at a desired frequency only after repeatedly overshooting the desired oscillation frequency during frequency. Accordingly, there occurs such a problem that this overshooting locking prolongs the frequency-locking time.

SUMMARY OF THE INVENTION

It is therefore an object of the present invention to provide a PLL frequency synthesizer with which noise or the fluctuation of the control voltage due to change-over of the switch is not generated even though the PLL frequency synthesizer switches frequency at high speed.

It is another object of the present invention to provide a PLL frequency synthesizer which enables stable frequency-locking operation even though the PLL frequency synthesizer switches frequency at high speed.

It is still another object of the present invention to provide a PLL frequency synthesizer which can suppress overshooting of the oscillation frequency when the PLL frequency synthesizer switches frequency at high speed.

It is a further object of the present invention to provide a PLL frequency synthesizer which can switch frequencies at high speed.

The PLL frequency synthesizer according to the present invention includes: a voltage controlled oscillator for outputting an oscillation signal having an oscillation frequency corresponding to a control voltage; a first variable frequency divider for dividing the oscillation frequency of the oscillation signal to supply a frequency-divided first frequency division signal; a reference frequency oscillator for supplying a reference signal having a reference frequency; a fixed frequency divider for dividing the frequency of the reference signal by a predetermined frequency divisor to supply a frequency-divided second frequency division signal; a phase comparator for comparing the first frequency division signal with the second frequency division signal to detect a phase difference and supplying a phase difference voltage corresponding with the phase difference; a loop filter for converting the phase difference voltage into the control voltage; and a control circuit for firstly producing a frequency which is substantially equal to a desired frequency when changing the oscillation frequency and secondly controlling in such a manner that the voltage controlled oscillator oscillates at the desired frequency.

Preferably, the control circuit may indicate a first frequency divisor to the first variable frequency divider when changing the oscillation frequency and direct a second frequency divisor corresponding with the desired frequency to the first variable frequency divider when the oscillation frequency reaches a predetermined frequency.

In addition, it is preferable that the control circuit includes: a frequency detector for detecting a frequency of the oscillation signal; and a controller for indicating to the first variable frequency divider a first frequency divisor which is used for producing a predetermined frequency between an oscillation frequency before the voltage controlled oscillator switches the oscillation frequency and an oscillation frequency after the same switches the oscillation frequency and directing a second frequency divisor to the first variable frequency divider in such a manner that the oscillation frequency after switching is produced when the frequency detected by the frequency detector reaches the predetermined frequency.

When the first oscillation frequency is changed to the second oscillation frequency, the control circuit may supply to the first variable frequency divider such a first frequency divisor that the voltage controlled oscillator oscillates at a third oscillation frequency between the first oscillation frequency and the second oscillation frequency and supply such a second frequency divisor that the second oscillation frequency is produced when the oscillation frequency of the voltage controlled oscillator first approximates and moves away from the second oscillation frequency.

According to the present invention, when changing the oscillation frequency, the frequency divisor of the variable frequency divider is first controlled in such a way that a frequency slightly different from a desired frequency is produced, and the frequency divisor is then changed to such a frequency divisor that the desired frequency is produced when the oscillation frequency approximates the desired frequency, thus carrying out rapid and stable frequency changing while suppressing overshooting.

BRIEF DESCRIPTION OF THE DRAWINGS

These and other objects, features and advantages of this invention will become more fully apparent from the following detailed description taken with the accompanying drawings in which.

In the drawings, the same reference numerals denote the same structural elements.

DESCRIPTION OF THE PREFERRED EMBODIMENTS

First, to facilitate an understanding of the present invention, a conventional PLL frequency synthesizer will be described with reference to FIG. 1.

Figure 1:
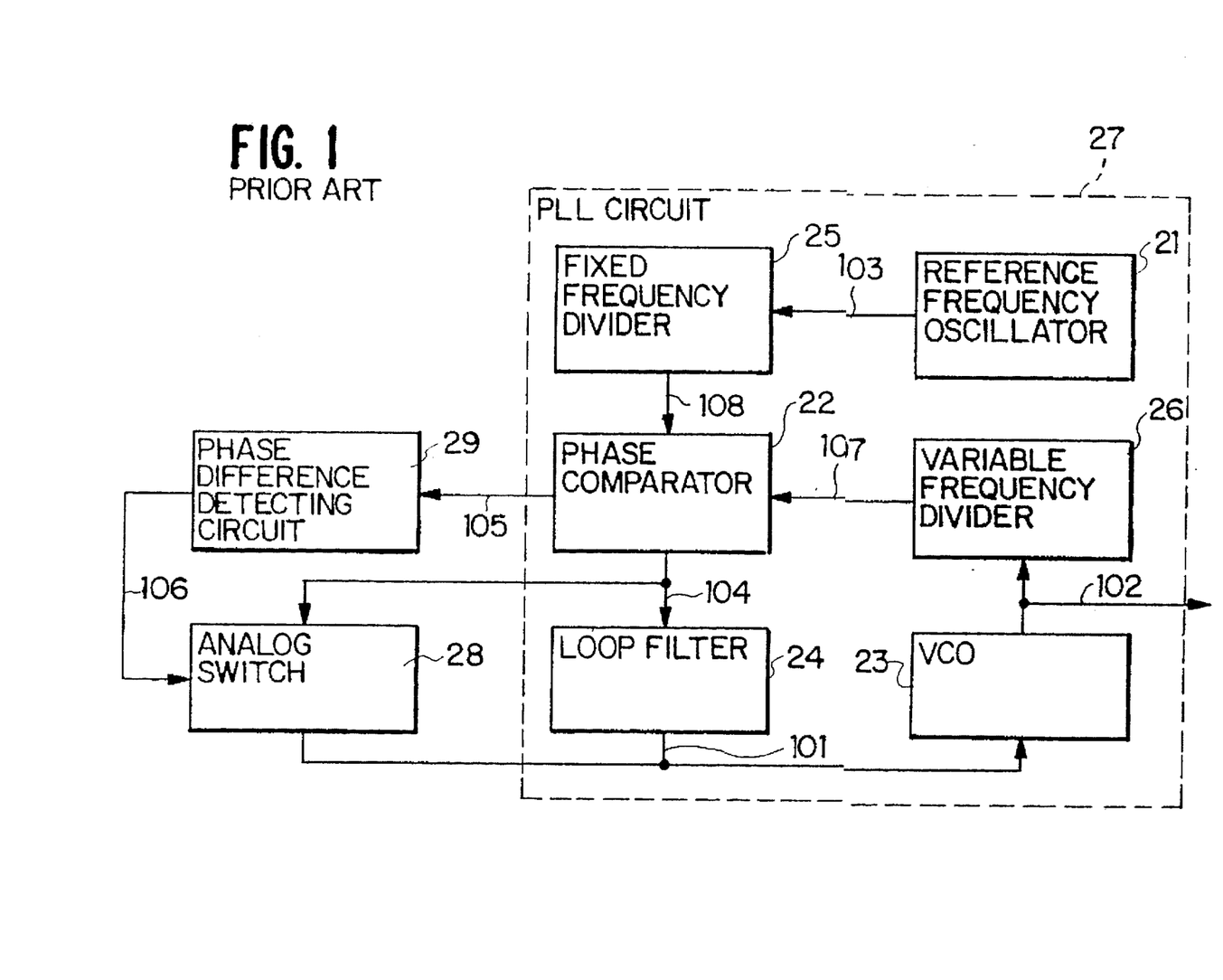
FIG. 1 is a structural block diagram showing a conventional PLL frequency synthesizer.

In FIG. 1, there is shown a PLL frequency synthesizer represented by simplifying the PLL frequency synthesizer disclosed in the above-described Japanese Laid-Open Patent Application No. 214925/1991 for facilitating its explanation.

In FIG. 1, the PLL frequency synthesizer includes a phase locked loop (PLL) circuit 27, an analog switch 28 and a phase difference detecting circuit 29. The PLL circuit 27 is constituted by: a reference frequency oscillator 21; a phase comparator 22; a voltage controlled oscillator (VCO) 23; a loop filter 24; a fixed frequency divider 25; and a variable frequency divider 26.

The VCO 23 controls a frequency of an output signal 102 in accordance with a control voltage 101. The variable frequency divider 26 divides the frequency of the output signal 102 of the VCO 23 and supplies a first frequency division signal 107 to the phase comparator 22. The reference frequency oscillator 21 outputs a reference signal 103 having a reference frequency. The fixed frequency divider 25 divides the frequency of the reference signal 103 and supplies a second frequency division signal 108 to the phase comparator 22. The phase comparator 22 compares the phase of the first frequency division signal 107 with that of the second frequency division signal 108 and supplies a control voltage 104 corresponding to a phase difference. The loop filter 24 provided with a capacitor smoothes the control voltage 104 and supplies a stable control voltage 101. The phase difference detecting circuit 29 supplies a switch control signal 106 in response to a phase difference signal 105 representing the phase difference from the phase comparator 22. The phase difference detecting circuit 29 so controls as to close the analog switch 28 when the phase difference exceeds a predetermined value. Thereafter, the phase difference detecting circuit 29 so controls as to open the analog switch 28 when the phase difference becomes less than the predetermined value. The analog switch 28 is provided in parallel with the loop filter 24 and is turned on or off in response to the switch control signal 106.

In the PLL frequency synthesizer, the analog switch 28 is turned off when the phase difference indicated by the phase difference signal 105 is below a predetermined value. At this time, the response characteristics of the loop become unstable. The switching noise is also generated. Further, since the voltage charged in the loop filter 24 is different from the control voltage 104, the control voltage 101 which is to be supplied to the VCO 23 fluctuates.

Accordingly, the frequency-locking time is prolonged because of the fluctuation of the control voltage 101, although the oscillation frequency approximates a desired frequency.

Further, the repetition of overshooting of the oscillation frequency prolongs the frequency-locking time.

The present invention will now be described in connection with FIGS. 2 to 6.

Figure 2:
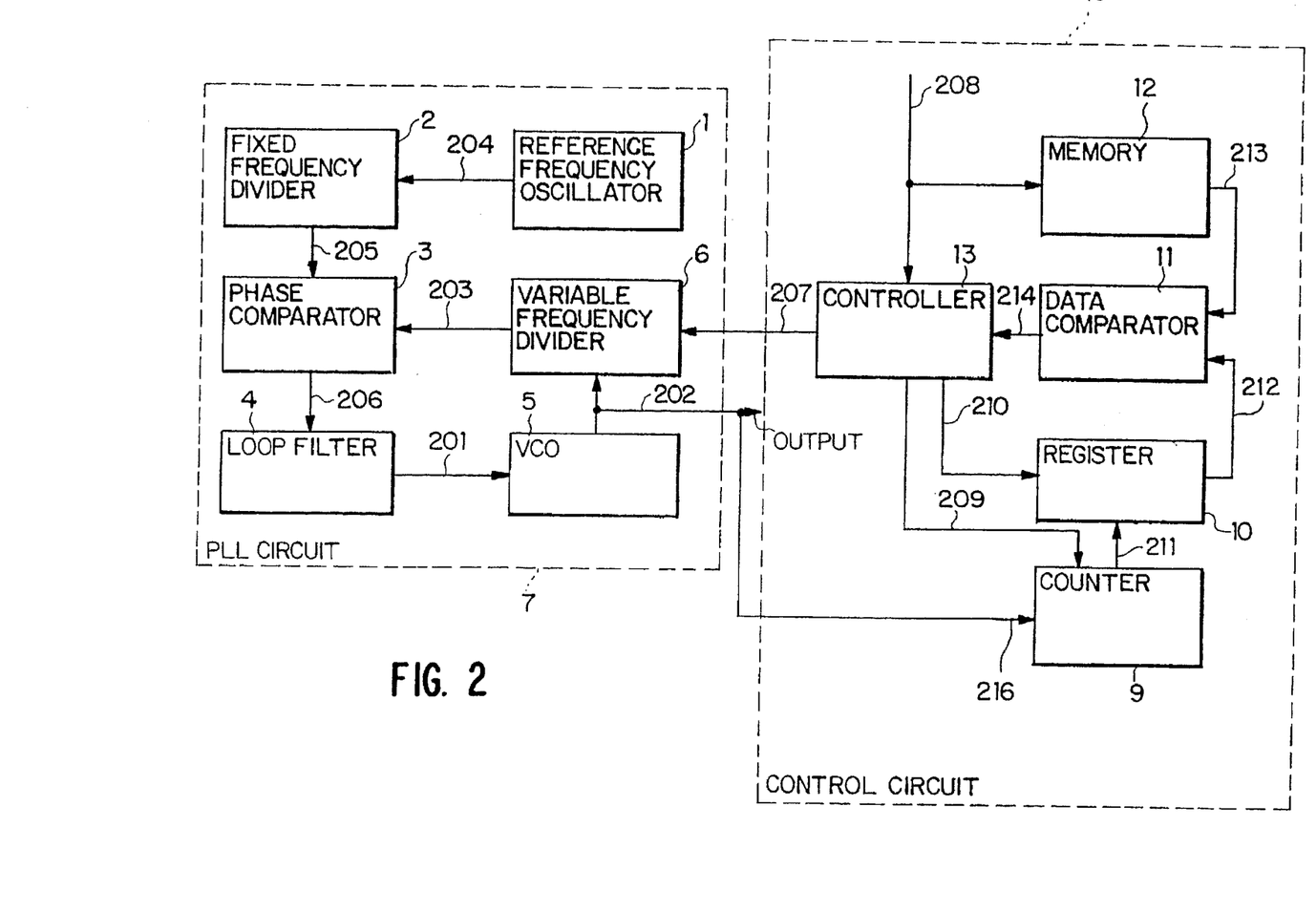
FIG. 2 is a structural block diagram showing a preferred embodiment according to the present invention.

FIG. 2 is a block diagram showing a preferred embodiment according to the present invention. The PLL frequency synthesizer according to the present invention is constituted by a PLL circuit 7 and a control circuit 16. The PLL circuit 7 includes: a reference frequency oscillator 1; a fixed frequency divider 2; a phase comparator 3; a loop filter 4; a voltage controlled oscillator 5; and a variable frequency divider 6. The control circuit 16 is composed of: a counter 9; a register 10; a data comparator 11; a memory 12; and a controller 13.

The VCO 5 supplies an oscillation signal 202 having an oscillation frequency corresponding with a control voltage 201 to the variable frequency divider 6. The variable frequency divider 6 divides the frequency of the oscillation signal 202 in response to a first control signal 207 and supplies a first frequency division signal 203 to the phase comparator 3. The reference frequency oscillator 1 supplies a reference signal 204 having a reference frequency to the fixed frequency divider 2. The fixed frequency divider 2 divides the frequency of the reference signal 204 with a predetermined frequency division ratio and supplies a second frequency division signal 205 to the phase comparator 3. The phase comparator 3 compares the phase of the first frequency division signal 203 with that of the second frequency division signal 205 and supplies a control voltage 206 corresponding with a phase difference to the loop filter 4. The loop filter 4, which is preferably provided with a capacitor, smoothes the control voltage 206 and outputs a stable control voltage 201.

When the oscillation frequency of the oscillation signal 202 is changed, to the controller 13 is supplied from a non-illustrated circuit a data signal 208 indicating a desired frequency which is intended to be finally output from the synthesizer. In response to this supply, the controller 13 outputs the first control signal 207 for controlling a frequency divisor of the variable frequency divider 6. At this time, the controller 13 supplies to the variable frequency divider 6 a control signal which indicates a frequency divisor smaller than a frequency divisor which instructs to output the desired oscillation frequency. Preferably, a frequency lower than the desired frequency is read out of a memory (not shown) in the controller 13 in response to the data signal 208. Then, the controller 13 calculates the frequency divisor corresponding to the frequency lower than the desired frequency. The PLL circuit 7 so operates as to lock at a frequency lower than a desired frequency in response to the control signal 207.

The controller 13 outputs to the counter 9 a reset signal 209 for resetting the counter 9 every predetermined time. Simultaneously, the controller 13 supplies a second control signal 210 to the register 10.

The counter 9 counts the oscillation signal 202 and supplies a counted value 211 to the register 10. The counter 9 resets the counted value in accordance with the reset signal 209 from the controller 13. The register 10 accumulates the counted value 211 and supplies data 212 corresponding with the counted value 211 to the data comparator 11 in accordance with the second control signal 210. Since the second control signal 210 and the reset signal 209 are simultaneously output from the controller 13, the data 212 corresponds with the oscillation frequency of the oscillation signal 202.

In the memory 12 are stored frequency data corresponding to a plurality of frequencies. The memory circuit 12 supplies frequency data 213 indicating lower frequencies than a desired frequency to the data comparator 11 in response to the data signal 208. The data comparator 11 compares the frequency data 213 with the data 212 from the register 10. When both the data are found to be coincident with each other as a result of comparison, a coincidence signal 214 representing the coincidence is supplied to the controller 13. In response, the controller 13 supplies to the variable frequency divider 6 the first control signal 207 indicating such a frequency divisor that the synthesizer outputs a desired oscillation frequency.

In this way, the frequency synthesizer is first controlled so as to produce a frequency lower than a desired frequency. The frequency synthesizer is then controlled so as to produce the desired frequency when the oscillation frequency approximates the desired frequency. Preferably, the frequency divisor used for frequency-dividing the oscillation signal of the VCO may be set to such a value that the synthesizer produces frequency lower than the desired frequency. When the oscillation frequency becomes close to the desired frequency, the frequency divisor is set to such a value that the synthesizer produces the desired frequency. The timing at which this frequency divisor is changed is previously obtained by experiments and the like so as to reduce overshooting and rapidly lock to the desired frequency. In the above embodiment, the frequency data 213 which control the timing at which the frequency divisor is changed are obtained by calculating based on a response characteristic of the loop or by experiments in advance and stored in the memory 12.

Figure 3:
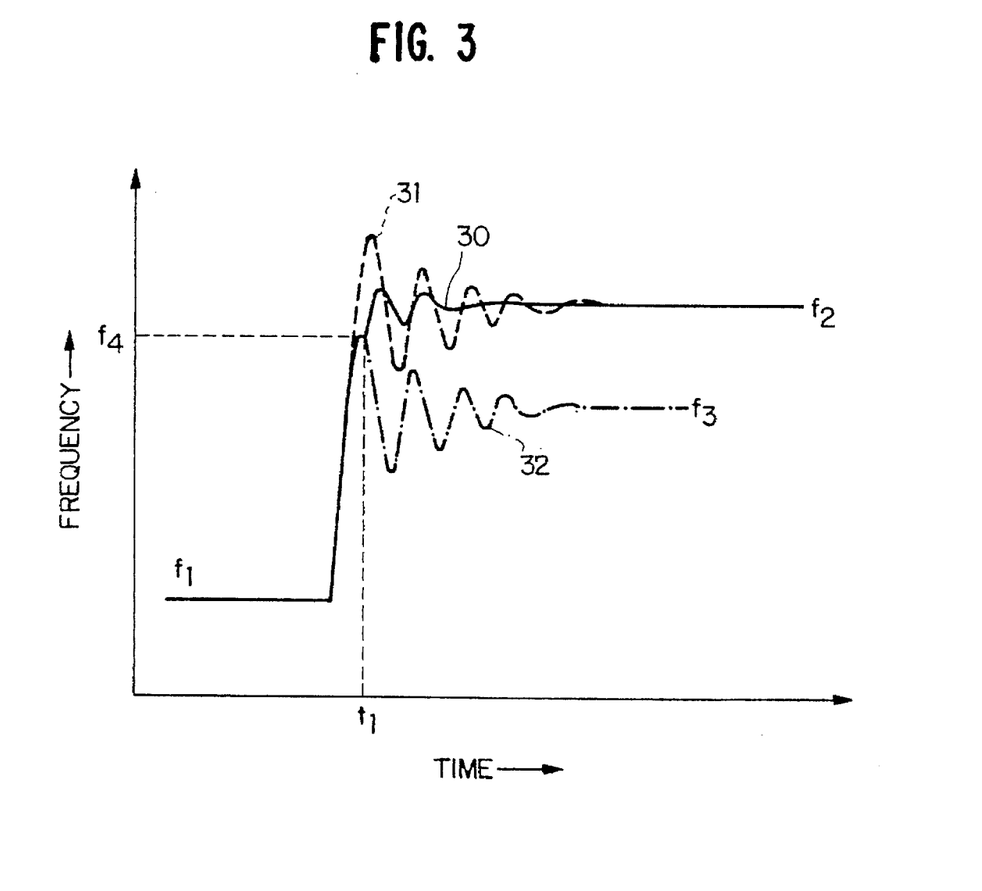
FIG. 3 is a view showing output frequencies of a PLL frequency synthesizer according to the present invention.

FIG. 3 illustrates the relationship between the oscillation frequency and the time when the frequency divisor is changed in the PLL frequency synthesizer according to the present invention.

Referring to FIG. 3, a curve 30 indicated by a solid line represents the oscillation frequency of the voltage controlled oscillator 5 shown in FIG. 2. A curve 31 indicated by a broken line represents the oscillation frequency in a case where a frequency divisor n1 corresponding to a desired frequency f2 is directed to the variable frequency divider. A curve 32 indicated by an alternate long and short dash line denotes the oscillation frequency in a case where a frequency divisor n2 corresponding to a frequency f3 lower than the desired frequency is directed to the variable frequency divider. The curves 31 and 32 show that the oscillation frequency is converged to a frequency corresponding with a directed frequency divisor while repeating the overshooting, respectively.

A description will now be given as to the case where the oscillation frequency is changed from f1 to f2. In the above-mentioned embodiment, the frequency divisor is first set to the frequency divisor n2 as shown by the curve 32, and the oscillation frequency traces the same locus with the curve 32. The frequency divisor is then changed from n2 to n1 when the oscillation frequency becomes f4 at the time t1. As a result, the frequency is rapidly stabilized at the desired frequency f2 with the overshooting being reduced, as compared to the curve 31. The frequency f4 is stored in the memory 12 as a data frequency in accordance with the oscillation frequency f2. That is, the frequency f4 which is the timing for changing the frequency divisor with which the frequency f1 is rapidly changed to f2 is previously obtained by experiments and the like, and the frequency f4 is stored in the memory 12 in accordance with the data signal representing the oscillation frequency f2. Similarly, the frequency which is the timing for changing the frequency divisor corresponding with each oscillation frequency is previously stored in the memory 12. When the data signal 208, indicating the oscillation frequency f2 is supplied to the controller 13, the controller 13 sends the first control signal 207 representing the frequency divisor n2 to the variable frequency divider 6. The counter 9 counts the oscillation frequency and supplies the counted value 211 to the register 10. The register 10 sends to the data comparator the data corresponding with the counted value, i.e., the data 212 representing the oscillation frequency. Upon receiving the data signal 208 indicating the oscillation frequency f2, the memory circuit 12 sends the frequency data 213 representing the frequency f4 to the data comparator 11. The data comparator 11 compares the frequency data 213 with the data 212. In other words, the data comparator 11 detects whether the oscillation frequency becomes f4. When the oscillation frequency becomes f4, the data comparator 11 feeds the coincidence signal 214 to the controller 13. In response to this signal, the controller 13 sends the first control signal 207 indicating the frequency divisor n1.

Figure 4:
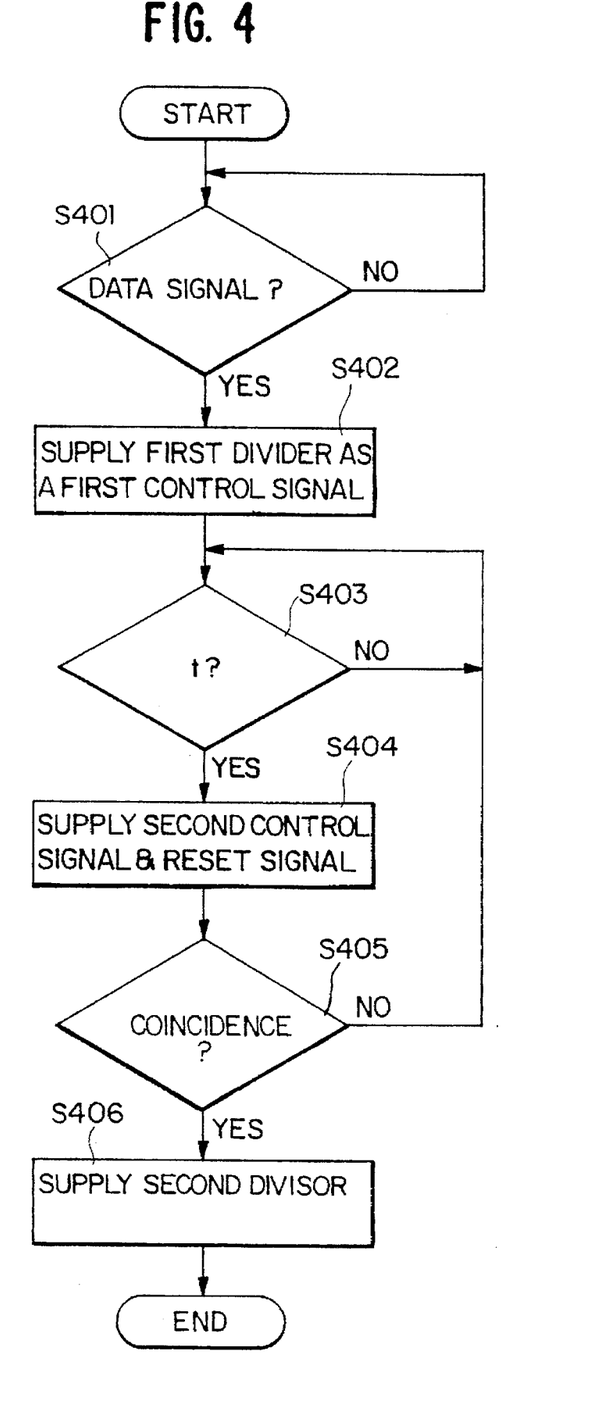
FIG. 4 is an operational flowchart of the controller illustrated in FIG. 2.

FIG. 4 illustrates the operational flowchart of the controller 13.

Upon receiving the data signal 208 used for changing the frequency to f2 from f1 (step S401), the controller 13 calculates the first frequency divisor n2 corresponding with the data signal 208 and supplies the first control signal 207 indicating this first frequency divisor to the variable frequency divider 6 (step S402). As described above, the first frequency divisor has such a value that a frequency lower than a desired frequency is output. When a predetermined time t lapses (step S403), the reset signal 209 and the second control signal 210 are sent to the counter 9 and the register 10, respectively (step S404). Subsequently, when the coincidence signal 214 is fed from the data comparator 11 (step S405), the second frequency divisor n1 used for outputting a desired frequency is calculated, and the first control signal 207 representing this second frequency divisor is supplied to the variable frequency divider 6 (step S406).

Figure 5:
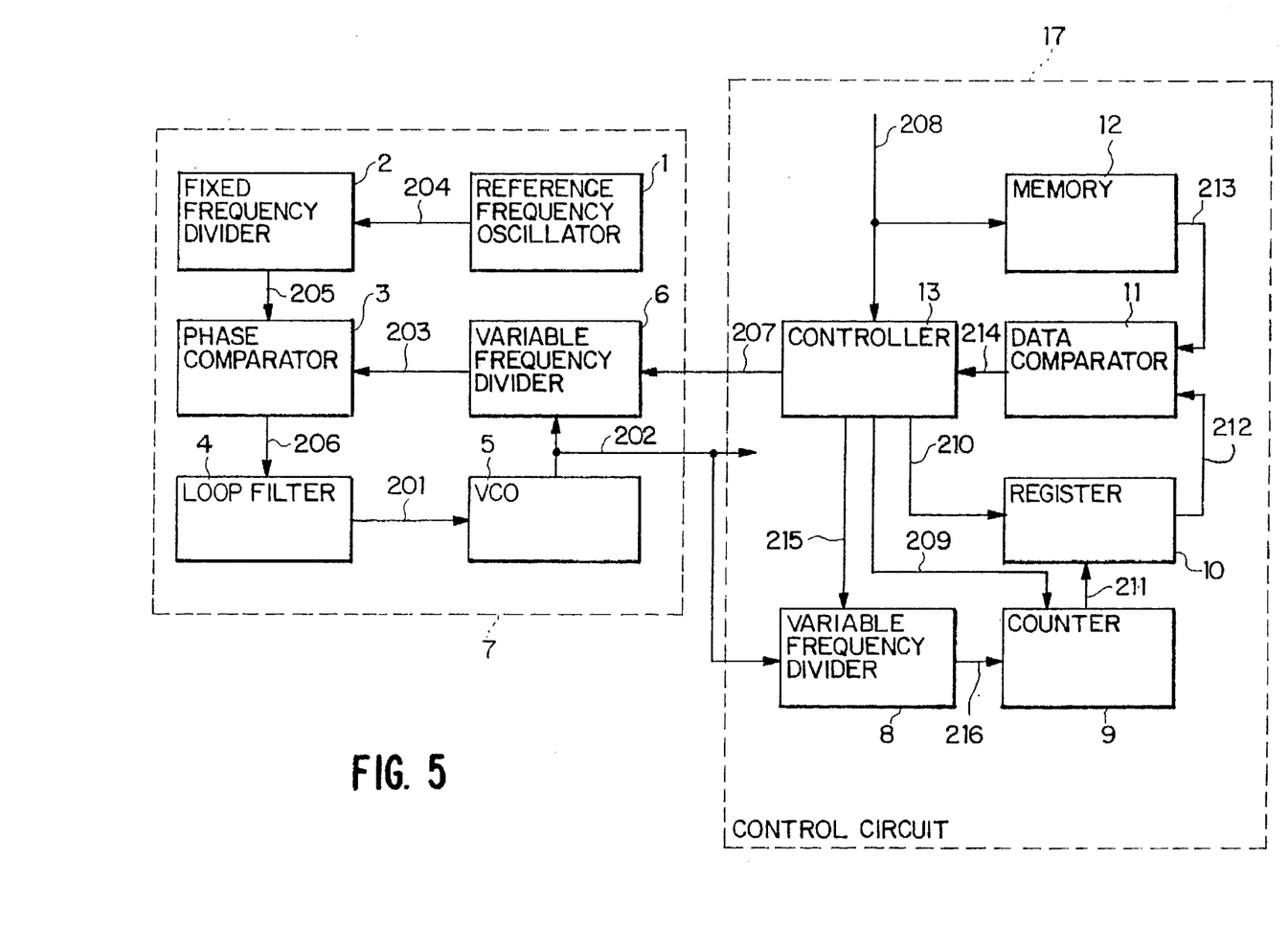
FIG. 5 is a structural block diagram showing another embodiment according to the present invention.

FIG. 5 is a block diagram showing another embodiment of this invention. As shown in FIG. 5, the arrangement in which the variable frequency divider 8 is provided within the control circuit 17 is different from the embodiment illustrated in FIG. 2. Since other configurations are substantially similar to those of the embodiment in FIG. 2, the explanation of the operation will be omitted in order to avoid the repetition. The variable frequency divider 8 submits the frequency of the oscillation signal 202 to frequency division in accordance with a third control signal 215 from the controller 13 and outputs the thus-divided signal as a third frequency division signal 216 to the counter 9. Preferably, the frequency of the third frequency division signal 216 from the variable frequency divider 8 may be higher than the frequency of the first frequency division signal 203 from the variable frequency divider 6.

With this operation, the counting numbers in the counter 9 are decreased. The counter 9 is therefore constituted by a counter whose maximum counting number is small. That is, the burden to the counter 9 is reduced.

Figure 6:
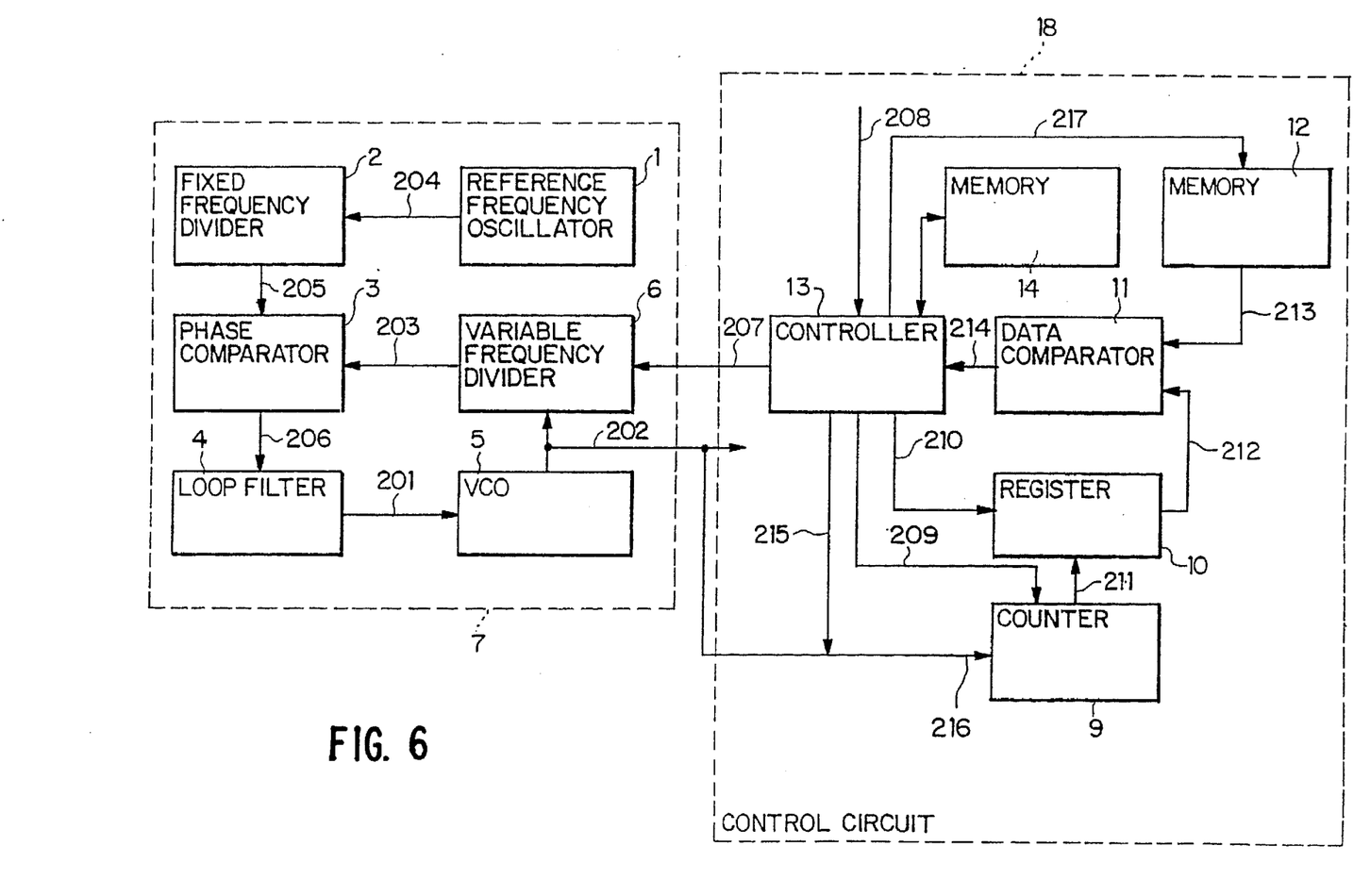
FIG. 6 is a structural block diagram showing still another embodiment according to the present invention.

FIG. 6 is a block diagram showing still another embodiment of the present invention. In FIG. 6, the arrangement in which a memory 14 is provided and the memory 12 is controlled by the controller 13 is different from that of the embodiment shown in FIG. 2. The overshooting in the locking operation of the PLL frequency synthesizer varies depending on the difference between the frequencies before and after the frequency output from the PLL frequency synthesizer is switched. The frequency data 213 should be changed on the basis of the difference. The frequency before switching is stored in the memory 14 by the controller 13 in such a manner that the frequency divisor of the variable frequency divider 6 can be switched at an optimum timing. The controller 13 obtains the difference between the frequencies before and after the switching and finds the timing for switching the frequency divisor of the variable frequency divider 6 on the basis of this difference in frequency. The controller 13 calculates the difference and the frequency supplied to the data comparator 11 from the memory 12. The memory 12 outputs the frequency data addressed by the controller 13. Then, the controller 13 calculates the frequency divisor of the variable frequency divider 6. Such an operation can reduce the overshooting in the locking operation.

Figure 7:
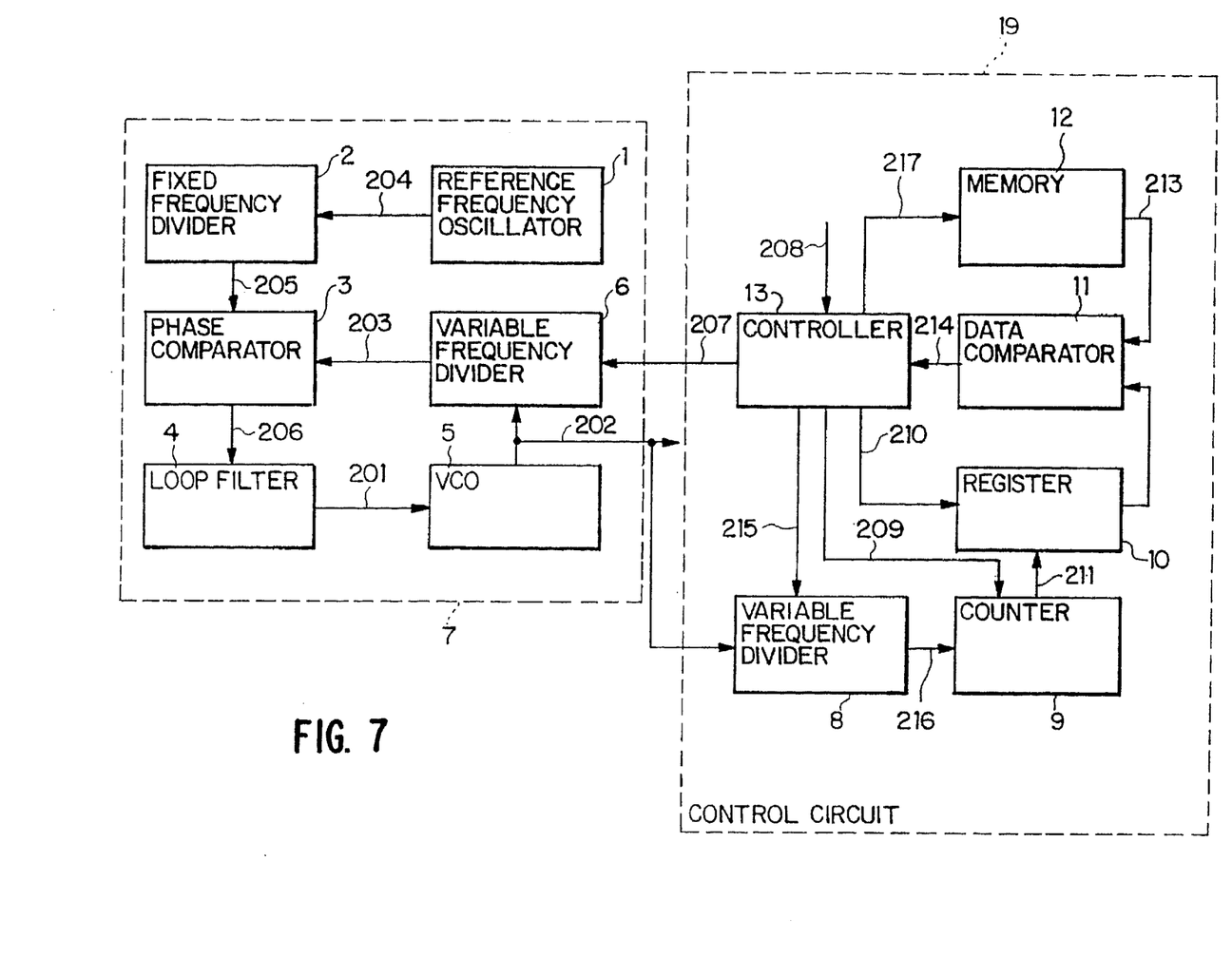
FIG. 7 is a structural block diagram showing a further embodiment according to the present invention.

FIG. 7 is a block diagram showing a further embodiment of the present invention. In FIG. 7, the difference from the embodiment illustrated in FIG. 5 is that the memory circuit 15 to which data can be written is provided instead of the memory circuit 12. Referring to FIG. 7, the frequency data 213 from the memory 15 is controlled in response to an optimum third frequency division signal 216 of the variable frequency divider 8. Namely, the frequency data 213 which is a reference for comparison in the data comparator 11 can be changed. With this operation, the controller 13 can rewrite the frequency data 213 which is a reference for comparison in the data comparator 11 in accordance with the data signal 213, thus carrying out the appropriate comparison.

In the above-described embodiments, a frequency divisor such that the synthesizer can output a frequency lower than a desired frequency is directed to the variable frequency divider, and a frequency divisor corresponding with the desired frequency is indicated to the variable frequency divider 6 when the oscillation frequency becomes a predetermined frequency.

In the present invention, however, after a frequency divisor for indicating a frequency lower than a desired frequency is set, the oscillation frequency may be constantly monitored, and the frequency divisor may be changed when the oscillation frequency reaches a frequency slightly lower than a desired frequency.

Although the oscillation frequency is changed from a lower frequency to a higher frequency in the above-described embodiments, the oscillation frequency may be changed from a higher frequency to a lower frequency. In this case, first the frequency higher than the desired frequency is selected.

In addition, the timing for changing the frequency is not restricted to the first time when the oscillation frequency reaches the frequency data from the memory circuit, and it may be set to the second time or others.

As described above, according to the present invention, the stable frequency-locking operation is enabled. Further, since the overshooting of the oscillation frequency is suppressed, the frequency can be changed at high speed.

While the invention has been described with reference to specific embodiments thereof, it will be appreciated by those skilled in the art that numerous variations, modifications, and embodiments are possible, and accordingly, all such variations, modifications and embodiments are to be regarded as being within the spirit and scope of the invention.

What is claimed is:

1. A PLL frequency synthesizer comprising:
   a voltage controlled oscillator for supplying an oscillation signal having an oscillation frequency corresponding to a control voltage;
   a first variable frequency divider for dividing the oscillation frequency of said oscillation signal to supply a frequency-divided first frequency division signal;
   a reference frequency oscillator for supplying a reference signal having a reference frequency;
   a fixed frequency divider for dividing the frequency of said reference signal by a predetermined frequency divisor to supply a frequency-divided second frequency division signal;
   a phase comparator for comparing said first frequency division signal with said second frequency division signal to detect a phase difference and for supplying a phase difference voltage corresponding to said phase difference;
   a loop filter for converting said phase difference voltage into said control voltage; and
   a control circuit for receiving an input signal specifying that the oscillation frequency of the oscillation signal is to be changed from a first frequency to a second frequency, for commanding a change in the oscillation frequency from the first frequency to a first predetermined frequency between the first frequency and the second frequency in response to the input signal, and for commanding a change in the oscillation frequency from the first predetermined frequency to the second frequency when the oscillation frequency reaches a second predetermined frequency which is between the first predetermined frequency and the second frequency.

2. A PLL frequency synthesizer as set forth in claim 1, wherein said control circuit controls a frequency divisor of said first variable frequency divider when said oscillation frequency is to by changed, by supplying said first variable frequency divider with a first frequency divisor corresponding to said first predetermined frequency of said oscillation signal in response to said input signal, and supplying said first variable frequency divider with a second frequency divisor corresponding to said second frequency when said oscillation frequency reaches said second predetermined frequency.

3. A PLL frequency synthesizer as set forth in claim 2, wherein said first frequency divisor is between a frequency divisor corresponding to said first frequency and said second frequency divisor.

4. A PLL frequency synthesizer as set forth in claim 2, wherein said control circuit comprises:
   a frequency detector for detecting the oscillation frequency of said oscillation signal; and
   a controller which supplies to said first variable frequency divider said first frequency divisor in response to said input signal and supplies to said first variable frequency divider said second frequency divisor when said frequency detector indicates that the oscillation frequency of said oscillation signal reaches said second predetermined frequency.

5. A PLL frequency synthesizer as set forth in claim 4, wherein said frequency detector includes:

a counter for counting said oscillation signal; and a register for accumulating a counted value of said counter.

6. A PLL frequency synthesizer as set forth in claim 5, wherein said frequency detector includes:

a memory for storing said second predetermined frequency; and a comparator which compares said second predetermined frequency with said counted value and supplies the result of comparison to said controller.

7. A PLL frequency synthesizer as set forth in claim 4, wherein said frequency detector includes:

a second variable frequency divider for dividing the frequency of said oscillation signal by a frequency divisor smaller than the frequency divisor in said first variable frequency divider;

a counter for counting a signal subjected to frequency division by said second variable frequency divider; and a register for accumulating a counted value of said counter.

8. A PLL frequency synthesizer as set forth in claim 7, wherein said frequency detector includes:

a memory portion for storing said second predetermined frequency; and a comparator for comparing said second predetermined frequency with said counted value to supply the result of comparison to said controller.

9. A PLL frequency synthesizer as set forth in claim 4, wherein said control circuit determines said predetermined frequency on the basis of a difference between said first frequency and said second frequency.

10. A PLL frequency synthesizer comprising:

a voltage controlled oscillator for outputting an oscillation signal having an oscillation frequency corresponding to a control voltage;

a first variable frequency divider for dividing the oscillation frequency of said oscillation signal to supply a frequency-divided first frequency division signal;

a reference frequency oscillator for supplying a reference signal having a reference frequency;

a fixed frequency divider for dividing the frequency of said reference signal by a predetermined frequency divisor to supply a frequency-divided second frequency division signal;

a phase comparator which compares said first frequency division signal with said second frequency division signal to detect a phase difference and which supplies a phase difference voltage corresponding to said phase difference;

a loop filter for converting said phase difference voltage into said control voltage; and a control circuit for controlling a frequency divisor of said first frequency division signal, wherein said control circuit supplies to said first variable frequency divider such a first frequency divisor that said voltage controlled oscillator produces a third oscillation frequency between a first oscillation frequency and a second oscillation frequency, and, when the oscillation frequency of said voltage controlled oscillator becomes said third oscillation frequency, said control circuit supplies such a second frequency divisor to said first variable frequency divider that said voltage controlled oscillator produces said second oscillation frequency.

11. A PLL frequency synthesizer comprising:

a voltage controlled oscillator for outputting an oscillation signal having an oscillation frequency corresponding to a control voltage;

a first variable frequency divider for dividing the oscillation frequency of said oscillation signal to supply a frequency-divided first frequency division signal;

a reference frequency oscillator for supplying a reference signal having a reference frequency;

a fixed frequency divider for dividing the frequency of said reference signal by a predetermined frequency divisor to supply a frequency-divided second frequency division signal;

a phase comparator which compares said first frequency division signal with said second frequency division signal to detect a phase difference and which supplies a phase difference voltage corresponding to said phase difference;

a loop filter for converting said phase difference voltage into said control voltage; and a control circuit for controlling a frequency divisor of said first frequency division signal, wherein said control circuit supplies to said first variable frequency divider such a first frequency divisor that said voltage controlled oscillator produces a third oscillation frequency between a first oscillation frequency and a second oscillation frequency, and, when the oscillation frequency of said voltage controlled oscillator overshoots said third oscillation frequency and approaches said second oscillation frequency, said control circuit supplies such a second frequency divisor to said first variable frequency divider that said voltage controlled oscillator produces said second oscillation frequency.

* * * * *